United States Patent
Rajendran et al.

(10) Patent No.: US 10,456,920 B2
(45) Date of Patent: Oct. 29, 2019

(54) PROXIMITY ROBOT BLADE DETECTION AND AUTO RETRACTION

(71) Applicant: Samsung Electronics Co., Ltd., Suwon-si, Gyeonggi-do (KR)

(72) Inventors: Surya Rajendran, Cedar Park, TX (US); Luis Alberto Hurtado, Pflugerville, TX (US); Dennis Michael Winters, Round Rock, TX (US)

(73) Assignee: SAMSUNG ELECTRONICS CO., LTD. (KR)

(*) Notice: Subject to any disclaimer, the term of this patent is extended or adjusted under 35 U.S.C. 154(b) by 216 days.

(21) Appl. No.: 15/686,140

(22) Filed: Aug. 24, 2017

(65) Prior Publication Data

US 2019/0061165 A1  Feb. 28, 2019

(51) Int. Cl.
| | | |
|---|---|---|
| *H01L 21/67* | (2006.01) | |
| *B25J 11/00* | (2006.01) | |
| *B25J 9/16* | (2006.01) | |
| *H01L 21/687* | (2006.01) | |
| *H01L 21/68* | (2006.01) | |

(52) U.S. Cl.
CPC ......... *B25J 11/0095* (2013.01); *B25J 9/1676* (2013.01); *H01L 21/68* (2013.01); *H01L 21/68707* (2013.01); *Y10S 901/09* (2013.01)

(58) Field of Classification Search
CPC ............... Y10S 901/09; Y10S 414/135; Y10S 294/902; B25J 11/0095; B25J 9/1676; B25J 9/1692; H01L 21/68707; H01L 21/67259; H01L 21/68

USPC .......... 700/255, 250, 262; 901/2, 8, 46; 318/568.21, 568.12, 568.16; 414/938, 414/935
See application file for complete search history.

(56) References Cited

U.S. PATENT DOCUMENTS

| | | | |
|---|---|---|---|
| 5,668,452 A | 9/1997 | Villarreal et al. | |
| 6,318,957 B1 | 11/2001 | Carr et al. | |
| 7,108,476 B2 * | 9/2006 | Astegno | H01L 21/6835 414/416.01 |
| 7,930,061 B2 | 4/2011 | Rice et al. | |
| 8,944,738 B2 | 2/2015 | van der Meulen | |
| 2010/0070077 A1 * | 3/2010 | Le | B25J 9/1692 700/254 |

* cited by examiner

*Primary Examiner* — Dalena Tran
(74) *Attorney, Agent, or Firm* — Renaissance IP Law Group LLP

(57) ABSTRACT

A system to process semiconductor wafers includes an end effector, a proximity sensor and a controller. The end effector may be adapted to handle a semiconductor wafer. The proximity sensor may be attached to the end effector and may output a first sensor signal if a distance between the end effector and an object separated from the end effector is less than or equal to a first predetermined distance. The controller is responsive to the first sensor signal to slow a movement of the end effector. The proximity sensor further outputs a second sensor signal if the distance between the end effector and the object is less than or equal to a second predetermined distance in which the second predetermined distance being less than the first predetermined distance. The controller is responsive to the second sensor signal to stop movement of the end effector.

15 Claims, 5 Drawing Sheets

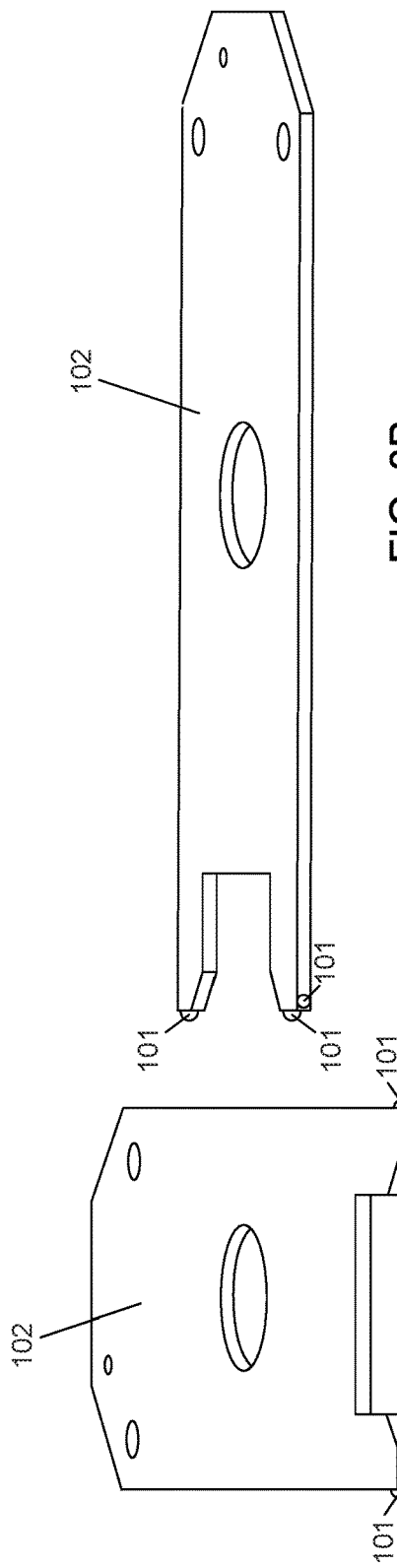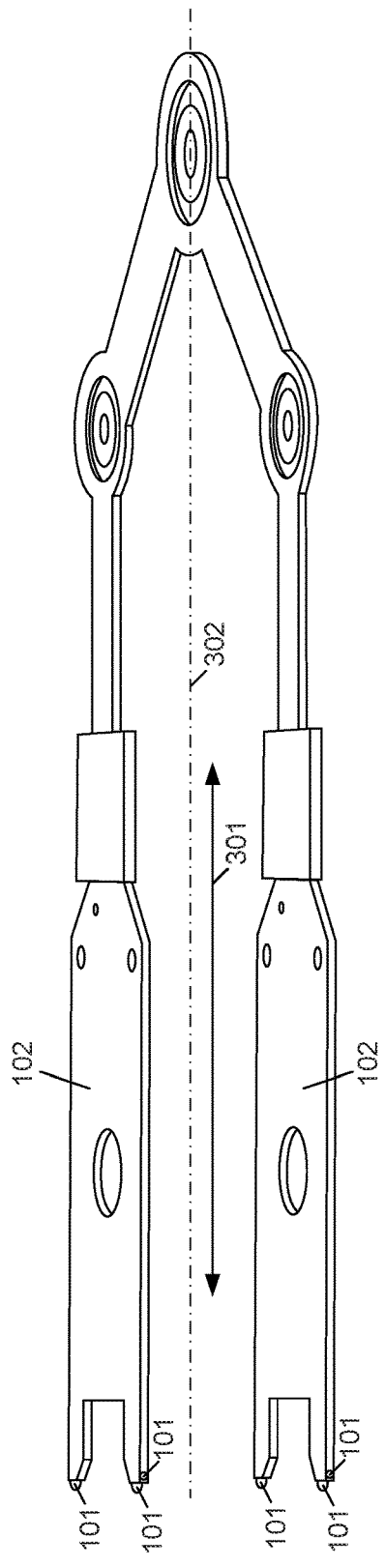

PROXIMITY ROBOT BLADE DETECTION AND AUTO RETRACTION

TECHNICAL FIELD

The subject matter disclosed herein generally relates to semiconductor wafer handling systems, and more particularly, to an apparatus and a method that detects the proximity of an object to an end effector of a semiconductor wafer handling system and avoids a collision with the object.

BACKGROUND

Currently used wafer-handling robots used in the manufacturing industry utilize a pick, place and retract functionality. There have been multiple instances in which a robot blade breaks with/without a wafer on it when an object obstructs the movement of the robot blade. For example, if slit doors to a chamber do not open fully during wafer transfer into the chamber or a front opening unified pod (FOUP) having a double-slot wafer issue, or even an employee who may be located directly in the path of the moving robot, there is nothing preventing the robot from extending and causing damage or injury, as well as self-breakage of the robot blade.

SUMMARY

An example embodiment provides a system to process semiconductor wafers comprising an end effector, a proximity sensor and a controller. The end effector may be adapted to handle a semiconductor wafer in which the end effector may be capable of moving in a first direction. The proximity sensor may be attached to the end effector and may output a first sensor signal if a distance between the end effector and an object separated from the end effector in the first direction is less than or equal to a first predetermined distance. The controller may move the end effector in the first direction, and the controller may be responsive to the first sensor signal to slow a movement of the end effector in the first direction. For example, the controller may be responsive to the first sensor signal to slow the movement of the end effector in the first direction from about 1200 steps/s to about 800 steps/s. In one embodiment, the proximity sensor may further output a second sensor signal if the distance between the end effector and the object in the first direction is less than or equal to a second predetermined distance in which the second predetermined distance may be less than the first predetermined distance, and the controller may responsive to the second sensor signal to stop movement of the end effector. In another embodiment, the controller may be further responsive to the second sensor signal to move the end effector in a second direction after the movement of the end effector has been stopped in which the second direction may be in a direction that is substantially opposite to the first direction.

Another example embodiment provides a system to process semiconductor wafers comprises an effector, a proximity sensor and a controller. The end effector may be adapted to handle a semiconductor wafer in which the end effector may be capable of moving in a first direction. The proximity sensor may be attached to the end effector, and output a first sensor signal if a distance between the end effector and an object separated from the end effector in the first direction is less than or equal to a first predetermined distance. The controller may move the end effector in the first direction, and the controller may be responsive to the first sensor signal to stop a movement of the end effector in the first direction. In one embodiment, the controller may be further responsive to the first sensor signal to move the end effector in a second direction after the movement of the end effector has been stopped in which the second direction may be in a direction that is substantially opposite to the first direction. In another embodiment, the proximity sensor may further output a second sensor signal if the distance between the end effector and the object in the first direction is less than or equal to a second predetermined distance in which the second predetermined distance may be greater than the first predetermined distance, and the controller may be responsive to the second sensor signal to slow the movement of the end effector in the first direction.

Another example embodiment provides a method control an end effector of a system to handle semiconductor wafers, the method comprising: moving an end effector of the system in a first direction in which the end effector may be adapted to handle a semiconductor wafer; sensing by a proximity sensor a distance between an end effector of the system and an object separated from the end effector; outputting a first sensor signal from the proximity sensor if a distance between the end effector and the object in the first direction is less than or equal to a first predetermined distance; and slowing movement of the end effector in the first direction in response to the first sensor signal. In one embodiment, the method may further comprise outputting a second sensor signal from the proximity sensor if the distance between the end effector and the object in the first direction is less than or equal to a second predetermined distance in which the second predetermined distance may be less than the first predetermined distance, and stopping movement of the end effector in response to the second sensor signal.

BRIEF DESCRIPTION OF THE DRAWINGS

In the following section, the aspects of the subject matter disclosed herein will be described with reference to exemplary embodiments illustrated in the figures, in which:

FIGS. 3A and 3B respectively depict front and side perspective views of an example embodiment of an end effector that includes one or more proximity sensors that may be used in the example system of FIG. 1.

FIG. 3C depicts a side perspective view of an example embodiment of a robot arm that includes two end effectors each having one or more proximity sensors.

DETAILED DESCRIPTION

Figure 1:
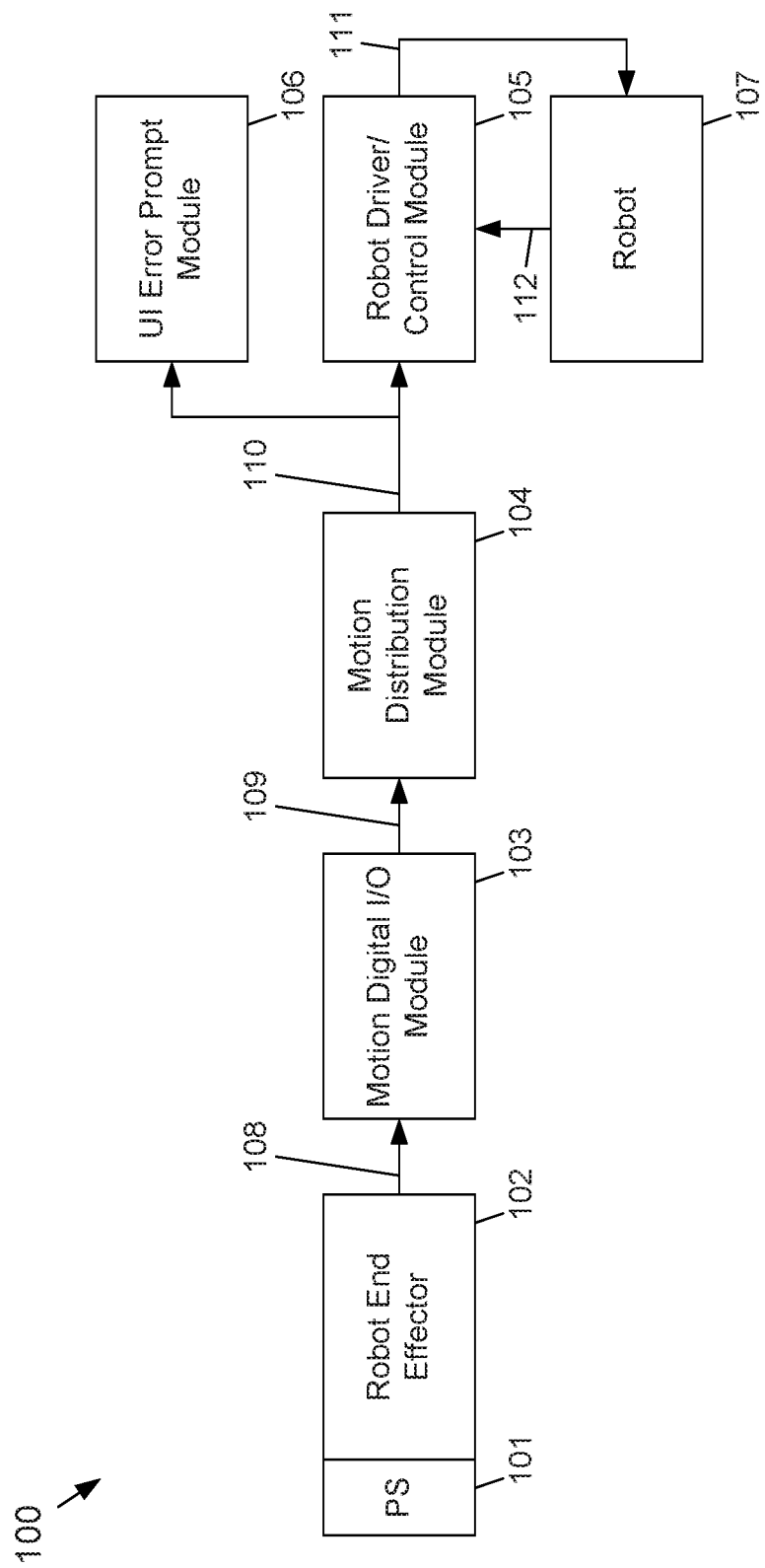
FIG. 1 depicts a block diagram of a proximity robot blade detection and auto retraction system according to one example embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. For example, the term "mod" as used herein means "modulo." It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. The term "software," as applied to any implementation described herein, may be embodied as a software package, code and/or instruction set or instructions. The term "hardware," as applied to any implementation described herein, may include, for example, singly or in any combination, hardwired circuitry, programmable circuitry, state-machine circuitry, and/or firmware that stores instructions executed by programmable circuitry. The modules may, collectively or individually, be embodied as software, firmware and/or hardware that forms part of a larger system, such as, but not limited to, an integrated circuit (IC), system on-chip (SoC) and so forth.

The subject matter disclosed herein provides a system that includes a proximity detection system in the tip of a robot blade, or end effector, that senses an object at a defined sensing distance and stops movement of the end effector to avoid a collision with the object. In one embodiment, an extension of the end effector is initially slowed, then stopped as the distance between the end effector and the object becomes less. In another embodiment, after the extension of the end effector has stopped, the system retracts the end effector back to a predetermined safe distance from the object.

FIG. 1 depicts a block diagram of a proximity robot blade detection and auto retraction system 100 according to one example embodiment. The system 100 may include one or more proximity sensors 101, a robot end effector 102, a motion digital input/output (I/O) module 103, a motion distribution module 104, a robot driver/control module 105, a user interface (UI) prompt module 106, and a robot 107. The modules 103-106 may, collectively or individually, be embodied as software, firmware and/or hardware that forms part of a larger system, such as, but not limited to, an integrated circuit (IC), system on-chip (SoC) and so forth.

The one or more proximity sensors 101 may be attached to a robot end effector 102, which, in turn is physically coupled to the robot 107, although not indicated in FIG. 1. The one or more proximity sensors 101 may sense the proximity of a wafer (not shown in FIG. 1) and/or the end effector 102 to a potential crash source (not shown) at a predetermined distance from the potential crash source, and output a sense signal 108. In one embodiment, the sense signal 108 may be an analog signal. In one embodiment, a proximity sensor 101 may be a capacitive proximity sensor. In another embodiment, a proximity sensor 101 may be an infrared proximity sensor. In still other embodiments, a proximity sensor 101 may be, but is not limited to, an inductive proximity sensor or an ultrasonic proximity sensor.

The sense signal 108 may be input to the motion digital I/O module 103, which converts the sensor signal 108 into a digital-type signal 109. In an embodiment in which the sense signal 108 is a digital signal, the functionality of the motion digital I/O module 103 to convert the sense signal 108 to be a digital signal may not be needed.

The output of the motion digital I/O module 103 may be received by the motion distribution module 104, which outputs a command signal 110 that triggers a UI alarm module 106, and that controls the robot driver/control module 105 to reduce the speed of the robot 107 and/or stop the motion of the driver. In one embodiment, the robot driver/control module 105 outputs a control signal 111 through an appropriate 0-axis driver to the robot 107. The robot 107 provides a feedback signal 112 that is used for monitoring the speed and/or position of the end effector 102 and/or robot 107.

In one embodiment, if the one or more proximity sensors 101 detect an object to be within about 10 mm, the control signal 111 slows the speed of an extension of the robot 107, for example, but not limited to, from about 1200 steps/s to about 800 steps/s, with a further decrease in extension speed of, for example, but not limited to, about 100 steps/s thereafter. If a distance of about 2.5 mm to the object is reached, the one or more proximity sensors 101 output a sense signal 108 that causes the robot driver/control module 105 to output a control signal 111 that includes a command to stop the extension of the robot. In one embodiment, the direction of extension of the end effector 102 may be linear. In another embodiment, the direction of extension of the end effector may be radial. In still another embodiment, the direction of extension of the end effector may be a combination of linear and radial directions.

In response to the commands output from the robot driver/control module 105, the robot 107 slows, and then stops so that a manual intervention may be performed to verify the condition of the wafer/robot. In one embodiment, after the robot 107 initially stops, the control signal 111 may include a command causing the robot 107 to retract a predetermined distance, such as about 10 mm, and then stops so that a manual intervention may be performed to verify the condition of the wafer/robot.

Figure 2A:
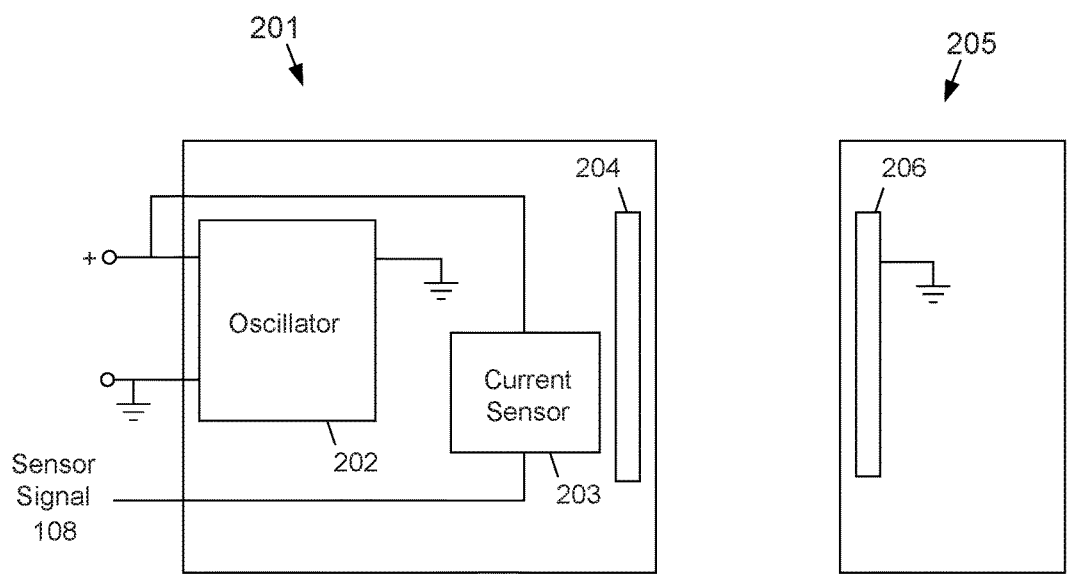
FIG. 2A depicts a functional block diagram of an example embodiment of a capacitive proximity sensor that may be used for a proximity sensor in the example system of FIG. 1.

FIG. 2A depicts a functional block diagram of an example embodiment of a capacitive proximity sensor 201 that may be used for a proximity sensor 101. The capacitive proximity sensor 201 may include an oscillator 202, a current sensor 203 and a capacitive plate 204. An output of the oscillator 202 is coupled to the current sensor 203. The current sensor 203 is coupled to the capacitive plate 204. If the proximity sensor 201 is relatively far from an object 205, the oscillator 202 does not oscillator and the current sensor 203 does not detect current flowing to and from the capacitive plate 204. As the proximity sensor 201 moves closer to the object 205, a capacitance 206 that the object 205 represents causes current sourced by the oscillator 202 to flow into and out of the capacitive plate 204, which is sensed in a well-known manner by the current sensor 203. The current sensor 203 may be set to output a sensor signal 108 if the proximity sensor 201 is closer than a predetermined distance from the object 205. As the proximity sensor 201 moves closer to the object 205, the proximity sensor 201 may output another sensor signal 108 that is used to generate a stop command.

Figure 2B:
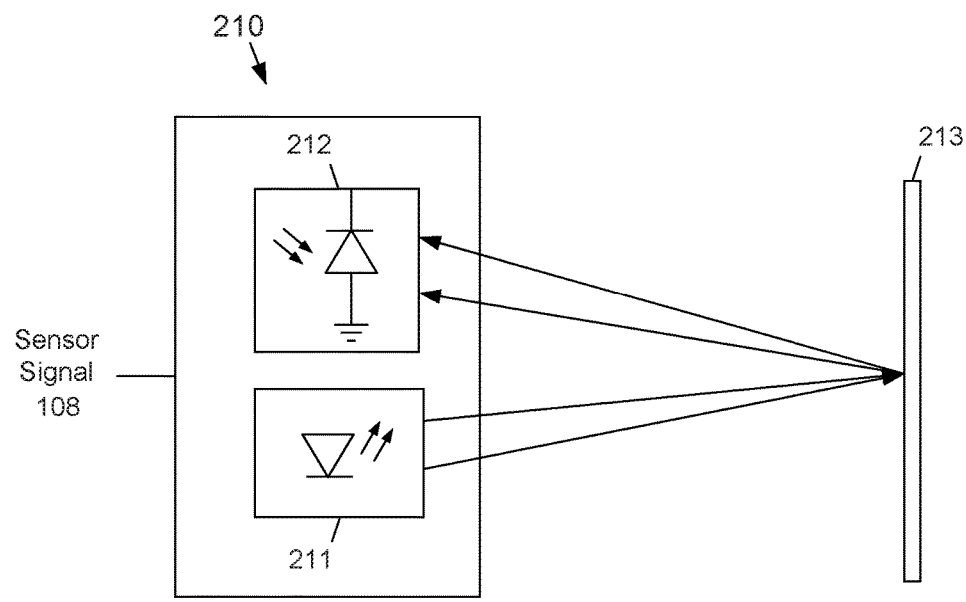
FIG. 2B depicts a functional block diagram of another example embodiment of an infrared proximity sensor that may be used for a proximity sensor in the example system of FIG. 1.

FIG. 2B depicts a functional block diagram of an example embodiment of an infrared proximity sensor 210 that may be used for a proximity sensor 101. The infrared proximity sensor 210 may include a transmitter light emitting diode (LED) 211 and a receiving LED 212. The transmitter LED 211 transmits an infrared light pulse that is reflected by an object 213 and then received by the receiving LED 212. As the proximity sensor 210 moves closer to the object 213, the time between the transmission of an infrared pulse by the transmitter LED 211 and the reception of the pulse at the receiving LED 212 may be used to determine a distance to the object 213. When the time between transmission and reception becomes less that a predetermined about of time that corresponds to a predetermined distance between the proximity sensor 210 and the object 213, the proximity sensor 210 outputs a sensor signal 108. As the proximity sensor 210 moves closer to the object 213, the proximity sensor 210 may output another sensor signal 108 that may be used to generate a stop command.

Figure 3D:
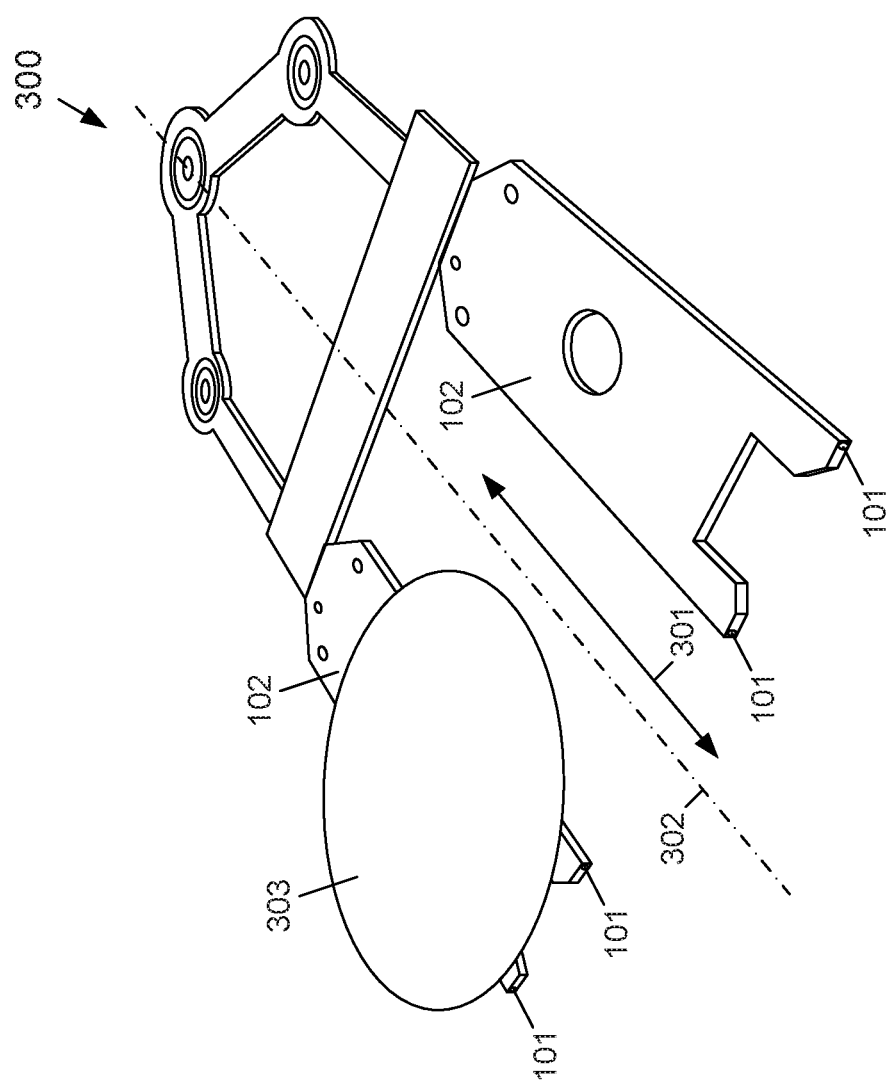
FIG. 3D depicts another perspective view of the example robot arm that may be used in the example system of FIG. 1.

FIGS. 3A and 3B respectively depict front and side perspective views of an example embodiment of an end effector 102 that includes one or more proximity sensors 101. FIG. 3C depicts a side perspective view of an example embodiment of a robot arm 300 that includes two end effectors 102 each having one or more proximity sensors 101. The end effectors 102 may be extended by robot 107 back and forth, as indicated by an arrow 301, along an axis 302 as the robot arm 300 moves back and forth. FIG. 3D depicts another perspective view of the example robot arm 300. An example disk 303 is depicted on one end effector 102 in FIG. 3D. In another embodiment, the robot arm 300 may include more or fewer proximity sensors 101 than depicted in FIGS. 3A-3D. Although axis 302 has been depicted as a linear axis, it should be understood that the direction of extension of the end effector 102 may be linear, radial or a combination of linear and radial directions. In one embodiment, wires that connect the one or more proximity sensors 101 to the motion digital I/O module 103 may be position in any convenient location along the bottom and/or sides of an end effector 102.

Figure 4:
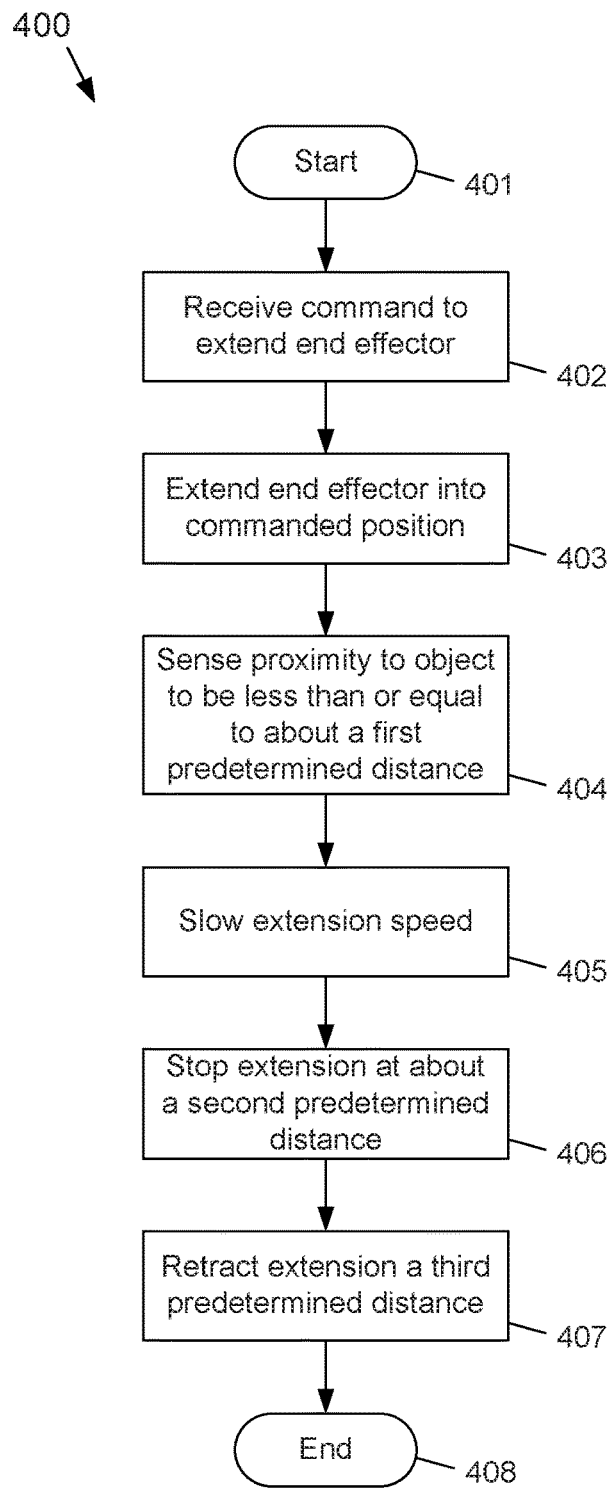
FIG. 4 depicts a flowchart of an example process provided by the proximity robot blade detection and auto retraction system of FIG. 1 according to one example embodiment.

FIG. 4 depicts a flowchart of an example process 400 provided by the proximity robot blade detection and auto retraction system 100 of FIG. 1 according to one example embodiment. The process 400 starts at 401. At 402, the robot 107 receives a command to extend the end effector 102 in a first direction to a predetermined position. At 403, the robot 107 extends to the end effector 102 into the commanded position. At 404, at least one of the proximity sensors 101 senses that a distance to an object is less than or equal to about a first predetermined distance. In one embodiment, the first predetermined distance may be about 10 mm; however, other distances may also be contemplated. At 405, if the one or more proximity sensors 101 detect an object to be within the first predetermined distance, the speed of an extension of the end effect 102 of the robot 107 is slowed. In one embodiment, the speed of the extension of the end effector 102 may be slowed from about 1200 steps/s to about 800 steps/s. In another embodiment, the slowing of the speed of the end effector 102 may also include a further decrease in extension speed of about 100 steps/s after the slowing at 405. In one embodiment, the UI error prompt module 106 may be triggered to output an alert notice indicating the slowing of the speed of the end effector 102. At 406, the extension of the end effector 102 is stopped when the distance to the object is less than a second predetermined distance, such as about 2.5 mm. In one embodiment, the UI error prompt module 106 may be triggered to output an alert notice indicating the stopping of the speed of the end effector 102. At 407, the end effector 102 is retracted a third predetermined distance, such as, but not limited to about 10 mm, in a second direction that, in one embodiment, is substantially opposite from the first direction. A manual intervention may be performed to verify the condition of the wafer/end effector/robot. The process ends at 408.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A system to process semiconductor wafers, the system comprising:

an end effector adapted to handle a semiconductor wafer, the end effector being capable of moving in a first direction;

a proximity sensor attached to the end effector, the proximity sensor outputting a first sensor signal if a distance between the end effector and an object separated from the end effector in the first direction is less than or equal to a first predetermined distance; and a controller to move the end effector in the first direction, the controller being responsive to the first sensor signal to slow a movement of the end effector in the first direction, wherein the proximity sensor further outputs a second sensor signal if the distance between the end effector and the object in the first direction is less than or equal to a second predetermined distance, the second predetermined distance being less than the first predetermined distance, and wherein the controller is responsive to the second sensor signal to stop movement of the end effector.

2. The system of claim 1, wherein the controller is further responsive to the second sensor signal to move the end effector in a second direction after the movement of the end effector has been stopped, the second direction being in a direction that is substantially opposite to the first direction.

3. The system of claim 2, wherein the controller moves the end effector about 10 mm in the second direction.

4. The system of claim 1, wherein the first predetermined distance comprises about 10 mm, and the second predetermined distance comprises about 2.5 mm.

5. The system of claim 1, wherein the controller is responsive to the first sensor signal to slow the movement of the end effector in the first direction from about 1200 steps/s to about 800 steps/s.

6. A system to process semiconductor wafers, the system comprising:

an end effector adapted to handle a semiconductor wafer, the end effector being capable of moving in a first direction;

a proximity sensor attached to the end effector, the proximity sensor outputting a first sensor signal if a distance between the end effector and an object separated from the end effector in the first direction is less than or equal to a first predetermined distance; and a controller to move the end effector in the first direction, the controller being responsive to the first sensor signal to stop a movement of the end effector in the first direction, wherein the controller is further responsive to the first sensor signal to move the end effector in a second direction after the movement of the end effector has been stopped, the second direction being in a direction that is substantially opposite to the first direction.

7. The system of claim 6, wherein the controller moves the end effector about 10 mm in the second direction.

8. The system of claim 7, wherein the proximity sensor further outputs a second sensor signal if the distance between the end effector and the object in the first direction is less than or equal to a second predetermined distance, the second predetermined distance being greater than the first predetermined distance, and wherein the controller is responsive to the second sensor signal to slow the movement of the end effector in the first direction.

9. The system of claim 8, wherein the first predetermined distance comprises about 2.5 mm, and the second predetermined distance comprises about 10 mm.

10. The system of claim 8, wherein the controller is responsive to the second sensor signal to slow the movement of the end effector in the first direction from about 1200 steps/s to about 800 steps/s.

11. A method to control an end effector of a system to handle semiconductor wafers, the method comprising:

moving an end effector of the system in a first direction, the end effector being adapted to handle a semiconductor wafer;

sensing by a proximity sensor a distance between an end effector of the system and an object separated from the end effector;

outputting a first sensor signal from the proximity sensor if a distance between the end effector and the object in the first direction is less than or equal to a first predetermined distance;

slowing movement of the end effector in the first direction in response to the first sensor signal, outputting a second sensor signal from the proximity sensor if the distance between the end effector and the object in the first direction is less than or equal to a second predetermined distance, the second predetermined distance being less than the first predetermined distance; and stopping movement of the end effector in response to the second sensor signal.

12. The method of claim 11, further comprising moving the end effector in a second direction after the movement of the end effector has been stopped, the second direction being in a direction that is substantially opposite to the first direction.

13. The method of claim 12, wherein moving the end effector in the second direction comprises moving the end effector about 10 mm in the second direction.

14. The method of claim 11, wherein the first predetermined distance comprises about 10 mm, and the second predetermined distance comprises about 2.5 mm.

15. The method of claim 11, wherein slowing movement of the end effector comprises slowing movement of the end effector in the first direction from about 1200 steps/s to about 800 steps/s.

* * * * *